United States Patent
Cao et al.

(10) Patent No.: US 11,402,522 B2
(45) Date of Patent: *Aug. 2, 2022

(54) IMAGE SENSOR

(71) Applicant: SHENZHEN XPECTVISION TECHNOLOGY CO., LTD., Shenzhen (CN)

(72) Inventors: Peiyan Cao, Shenzhen (CN); Yurun Liu, Shenzhen (CN)

(73) Assignee: SHENZHEN XPECTVISION TECHNOLOGY CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/036,071

(22) Filed: Sep. 29, 2020

(65) Prior Publication Data

US 2021/0011182 A1    Jan. 14, 2021

Related U.S. Application Data

(63) Continuation of application No. 16/177,631, filed on Nov. 1, 2018, now Pat. No. 10,823,859, which is a continuation of application No. PCT/CN2016/105809, filed on Nov. 15, 2016.

(51) Int. Cl.
| | |
|---|---|
| *G01T 1/24* | (2006.01) |
| *H04N 5/347* | (2011.01) |
| *H04N 5/378* | (2011.01) |
| *H04N 5/32* | (2006.01) |

(52) U.S. Cl.
CPC ............. *G01T 1/247* (2013.01); *G01T 1/24* (2013.01); *H04N 5/32* (2013.01); *H04N 5/347* (2013.01); *H04N 5/378* (2013.01)

(58) Field of Classification Search
CPC ......... G01T 1/24; G01T 1/247; A61B 6/4233; H04N 5/347; H04N 5/348; H04N 5/32
See application file for complete search history.

(56) References Cited

U.S. PATENT DOCUMENTS

| | | | | |
|---|---|---|---|---|
| 10,823,859 | B2* | 11/2020 | Cao | H01L 27/14663 |
| 2004/0026719 | A1* | 2/2004 | Barna | H04N 5/374 |
| | | | | 257/222 |
| 2005/0280728 | A1* | 12/2005 | Ishikawa | G06T 1/0007 |
| | | | | 348/294 |
| 2006/0176198 | A1* | 8/2006 | Doty | H03M 3/494 |
| | | | | 341/143 |
| 2006/0176205 | A1* | 8/2006 | Kawahito | H04N 1/195 |
| | | | | 341/155 |
| 2007/0004121 | A1* | 1/2007 | Eckstein | H01L 23/481 |
| | | | | 438/202 |
| 2007/0023669 | A1 | 2/2007 | Hefetz et al. | |
| 2010/0246919 | A1 | 9/2010 | Wainer | |
| 2011/0279725 | A1 | 11/2011 | Cazaux et al. | |
| 2012/0305786 | A1* | 12/2012 | Dierickx | G01J 1/44 |
| | | | | 250/371 |
| 2014/0285697 | A1* | 9/2014 | Nitta | H03M 1/1023 |
| | | | | 348/308 |
| 2019/0072681 | A1* | 3/2019 | Cao | G01T 1/24 |

\* cited by examiner

*Primary Examiner* — Chih-Cheng Kao

(74) *Attorney, Agent, or Firm* — IPro, PLLC; Qian Gu

(57) ABSTRACT

Disclosed herein is a method, comprising: exposing an image sensor to a scene; measuring, as analog signals, intensities of light from the scene by a plurality of pixels of the image sensor; converting the analog signals to digital signals; and determining a total intensity of light of the scene by calculating a sum of the digital signals.

13 Claims, 11 Drawing Sheets

Fig. 3

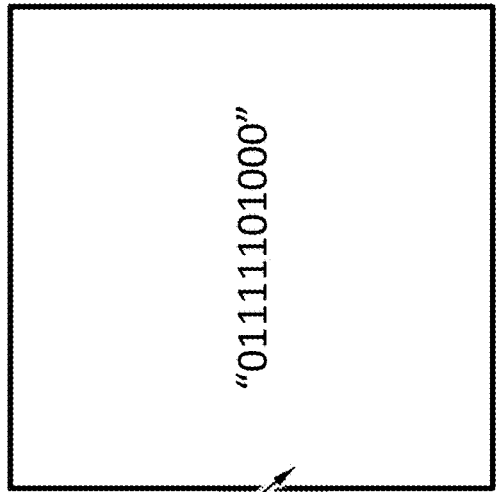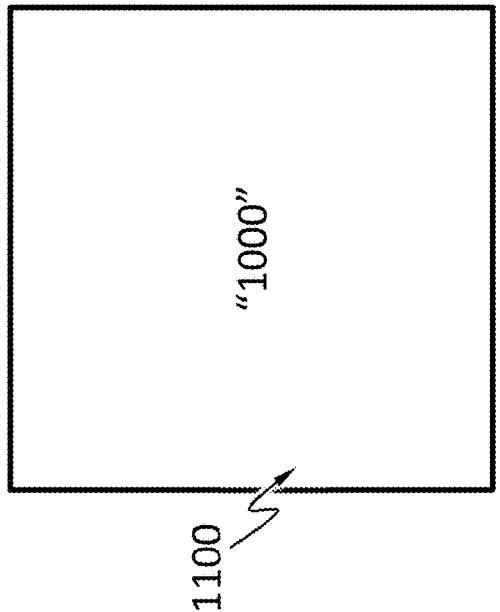

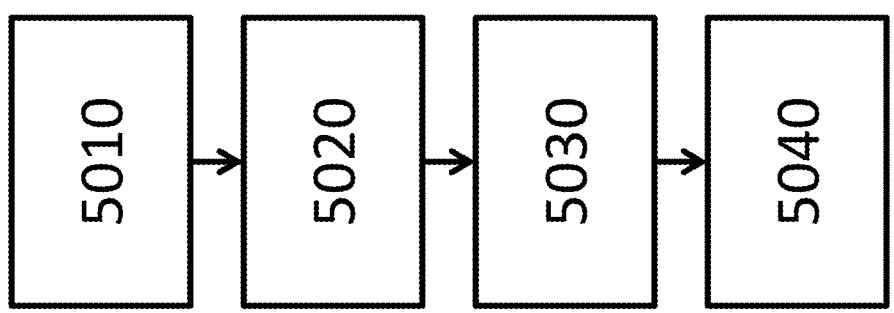

IMAGE SENSOR

TECHNICAL FIELD

The disclosure herein relates to image sensors.

BACKGROUND

An image sensor (also referred to as imaging sensor) is a sensor that detects and conveys the information that constitutes an image. An image sensor may do so by producing a signal that represents location-dependent attenuation of light (as the light passes through or reflect off a medium). The signal is usually an electric signal such as an electric voltage or current. The light an image sensor may detect is not limited visible light, but can be electromagnetic radiation in other wavelengths (e.g., infrared, ultraviolet, X-ray, gamma ray).

An image sensor may involve converting analog signals to digital signals. An analog signal is a signal whose time varying feature is not limited to a set of discrete values; a digital signal is a signal whose time vary feature is limited to a set of discrete values. The image sensor thus may include an analog-to-digital converter (ADC or A/D), which is a device that converts an analog signal to a digital signal. The ADC may use different coding schemes in the conversion. Typically the digital signal is a two's complement binary number that is proportional to the analog signal, but there are other possible coding schemes.

An ADC is often functionally defined by a few characteristics. One of these characteristics is the bandwidth, which is the range of frequencies of the analog signal the ADC can handle. Another is the dynamic range, which is the difference between the smallest and largest analog signals the ADC can resolve. The dynamic range is often measured as a ratio, or as a base-10 (decibel) or base-2 (doublings, bits or stops) logarithmic value. The dynamic range of an ADC may be affected by many factors, including the resolution (the number of output levels the ADC can quantize an analog signal to), linearity and accuracy (how well the quantization levels match the true analog signal) and jitter (the deviation from true periodicity of a presumed periodic signal). Another characteristic is the resolution, which is the number of discrete values the ADC can produce in the digital signal. Yet another characteristic is the step size, which is the voltage difference between one digital level (i.e. 0001) and the next one (i.e. 0010 or 0000).

An image sensor may use scintillators to convert a light it cannot other detect into a light it can detect. For example, in an image sensor for X-ray, a scintillator (e.g., sodium iodide) absorbs incident X-ray and emits visible light and the visible light is detected. The scintillator may be pixelated for various purposes, e.g., to limit visible diffusion within the scintillator.

SUMMARY

Disclosed herein is a method, comprising: exposing an image sensor to a scene; measuring, as analog signals, intensities of light from the scene by a plurality of pixels of the image sensor; converting the analog signals to digital signals; and determining a total intensity of light of the scene by calculating a sum of the digital signals.

According to an embodiment, the light is visible light.

According to an embodiment, the light is X-ray.

According to an embodiment, an ADC is used in converting the analog signals to the digital signals.

According to an embodiment, the plurality of pixels share the ADC.

According to an embodiment, the plurality of pixels share the ADC through a multiplexer.

Disclosed herein is an image sensor, comprising: a radiation absorption layer comprising a plurality of diodes; an electronics layer comprising a circuit configured to combine digital signals representing electric currents or electric voltages from the plurality of diodes; and a memory configured to store the combined digital signals.

According to an embodiment, the image sensor further comprises a multiplexer electrically connected to the diodes.

According to an embodiment, the multiplexer is configured to selectively direct analog signals from the diodes to an ADC and the ADC is configured to convert the analog signals to the digital signals.

According to an embodiment, the electronics layer comprises an electronics system for each of the diodes, the electronics system is configured to convert an analog signal from each of the diodes into one of the digital signals, and the multiplexer is configured to selectively direct the analog signals to the circuit.

Disclosed herein is an X-ray computed tomography (X-ray CT) system comprising any of the above imaging sensors and an X-ray source.

According to an embodiment, the method further comprises determining residue analog signals from the conversion of the analog signals to the digital signals; determining a total residue analog signal by summing the residue analog signals; determining a total residue digital signal by digitizing the total residue analog signal; wherein determining the total intensity comprises calculating a sum of the digital signals and the total residue digital signal.

According to an embodiment, the image sensor further comprises another ADC configured to a total residue analog signal.

According to an embodiment, the ADC uses delta-sigma modulation.

BRIEF DESCRIPTION OF FIGURES

FIG. 3 shows an exemplary top view of a portion of the image sensor in FIG. 2, according to an embodiment.

FIG. 4A-FIG. 4D schematically show a scheme of detecting an image with an image sensor, where the signals from some pixels of the image sensor are combined.

FIG. 5 schematically shows a flow chart for a method, according to an embodiment.

DETAILED DESCRIPTION

Figure 1:
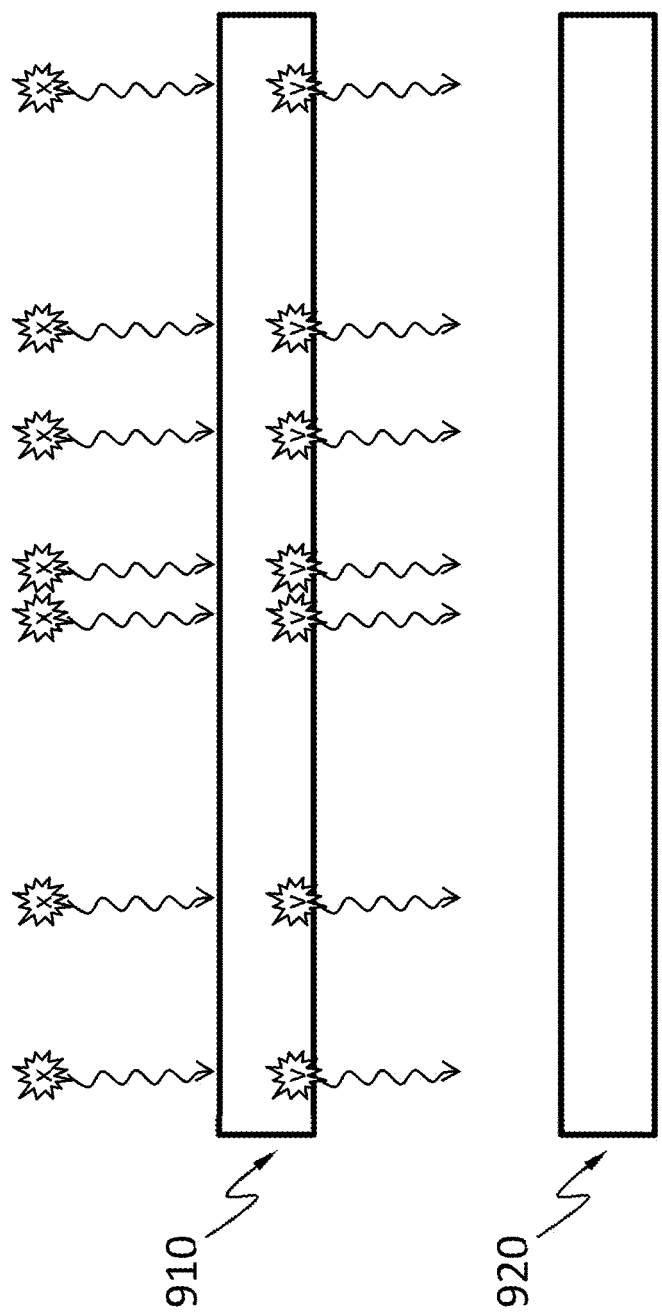
FIG. 1 schematically shows one pixel of a scintillator may be imaged by one pixel of an image sensor.

As FIG. 1 schematically shows, a pixel 910 of a scintillator is exposed to incident X-ray. The pixel 910 absorbs the X-ray and emits visible light. The visible light from the entire pixel 910 of the scintillator is directed to a pixel 920 of an image sensor configured to detect visible light. The visible light emitted from the pixel 910 of the scintillator is not spatially resolved by the pixel 920 of the image sensor; the visible light emitted from the pixel 910 of the scintillator is instead integrated and the pixel 920 of the image sensor detects the total amount of the visible light. The image sensor has an ADC that converts the amount of the visible light detected by the pixel 920 into a digital signal. The larger the pixel 910 of the scintillator is, the larger the total amount of the visible light emitted therefrom tends to be, and thus the larger the dynamic range of the ADC should be.

Figure 2:
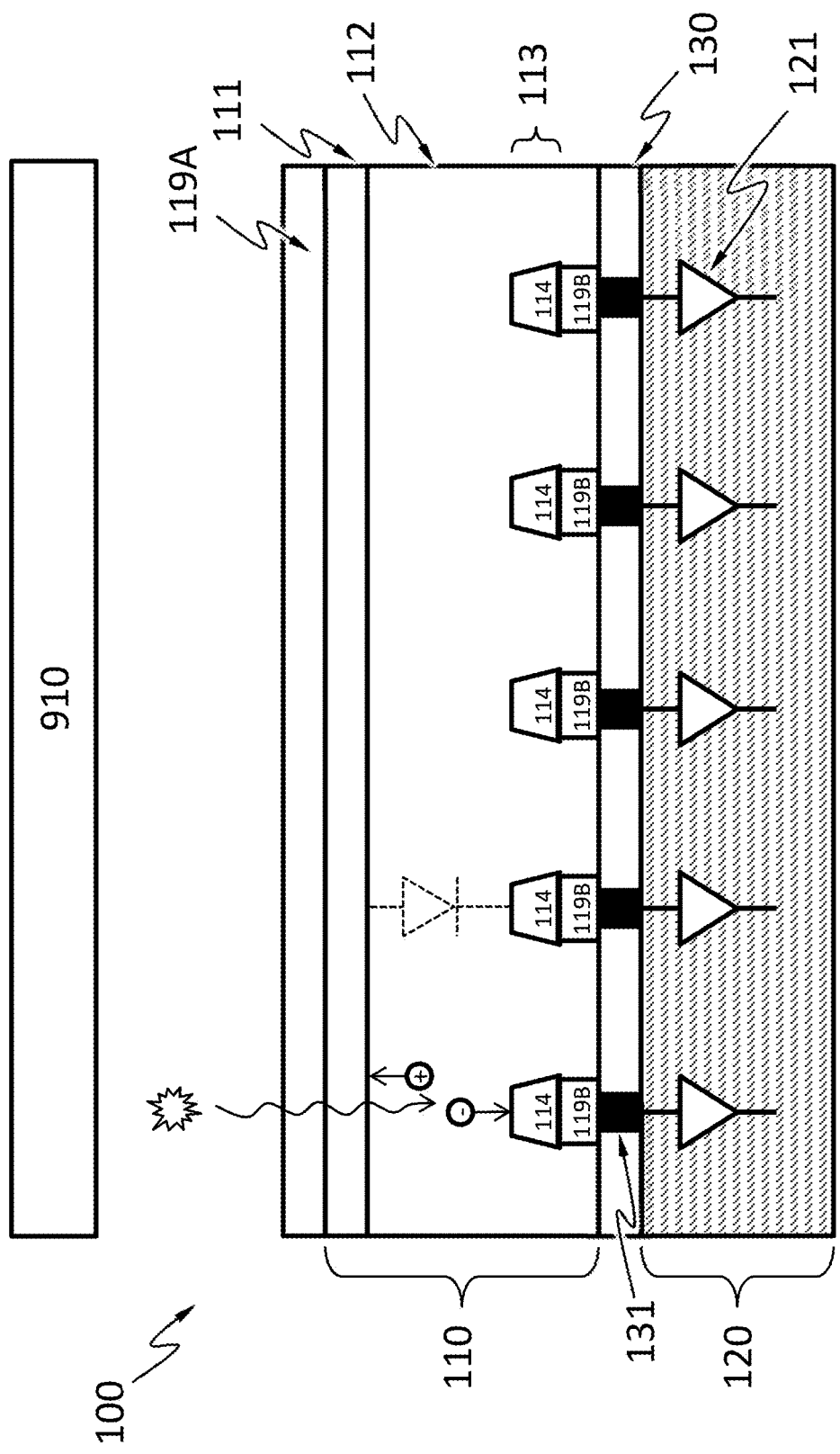
FIG. 2 schematically shows an image sensor, according to an embodiment.

FIG. 2 schematically shows an image sensor 100, according to an embodiment. The image sensor 100 may include a radiation absorption layer 110 and an electronics layer 120 (e.g., an ASIC) for processing or analyzing electrical signals incident radiation generates in the radiation absorption layer 110. The radiation absorption layer 110 may include a semiconductor material (e.g., silicon, germanium). The radiation absorption layer 110 may include one or more diodes (e.g., p-i-n or p-n) formed by a first doped region 111, one or more discrete regions 114 of a second doped region 113. The second doped region 113 may be separated from the first doped region 111 by an optional the intrinsic region 112. The discrete portions 114 are separated from one another by the first doped region 111 or the intrinsic region 112. The first doped region 111 and the second doped region 113 have opposite types of doping (e.g., region 111 is p-type and region 113 is n-type, or region 111 is n-type and region 113 is p-type). In the example in FIG. 2, each of the discrete regions 114 of the second doped region 113 forms a diode with the first doped region 111 and the optional intrinsic region 112. Namely, in the example in FIG. 2, the radiation absorption layer 110 has a plurality of diodes having the first doped region 111 as a shared electrode. The first doped region 111 may also have discrete portions. In an example, the image sensor 100 may be used to detect visible light emitted from the pixel 910 of a scintillator, where multiple discrete portions 114 are within the footprint of the pixel 910 of the scintillator, by combining the signals obtained from these multiple discrete portions 114.

When a photon hits the radiation absorption layer 110 including diodes, it may be absorbed and generate one or more charge carriers by a number of mechanisms. For example, an X-ray photon may generate 10 to 100000 charge carriers. The charge carriers may drift to the electrodes of one of the diodes under an electric field. The field may be an external electric field, for example, between electrical contacts 119A and 119B. For detection of visible light, the electrical contacts 119A may be a grid of metal or heavily doped semiconductor; the electrical contacts 119A may be a transparent material such as indium tin oxide. The electrical contact 119B may include discrete portions each of which is in electrical contact with the discrete regions 114. In an embodiment, the charge carriers may drift in directions such that the charge carriers generated by a single photon are not substantially shared by two different discrete regions 114 ("not substantially shared" here means less than 2%, less than 0.5%, less than 0.1%, or less than 0.01% of these charge carriers flow to a different one of the discrete regions 114 than the rest of the charge carriers). A pixel 150 associated with a discrete region 114 (or associated with the diode that comprise this discrete region 114) may be an area around the discrete region 114 in which substantially all (more than 98%, more than 99.5%, more than 99.9%, or more than 99.99% of) charge carriers generated by a photon incident therein flow to that discrete region 114. Namely, less than 2%, less than 1%, less than 0.1%, or less than 0.01% of these charge carriers flow beyond the pixel.

By measuring the drift current flowing into each of the discrete regions 114, or the rate of change of the voltage of each of the discrete regions 114, the number of photons absorbed (which relates to the incident radiation intensity) and/or the energies thereof in the pixels associated with the discrete regions 114 may be determined. The pixels may be organized in any suitable array, such as, a square array, a triangular array and a honeycomb array. The pixels may have any suitable shape, such as, circular, triangular, square, rectangular, and hexangular. The pixels may be individually addressable.

The electronics layer 120 may include an electronics system 121 suitable for processing or interpreting signals generated by photons incident on the radiation absorption layer 110. The electronics system 121 may include an analog circuitry such as a filter network, amplifiers, integrators, and comparators, or a digital circuitry such as a microprocessors, and memory. The electronics system 121 may include components shared by the pixels or components dedicated to a single pixel. For example, the electronics system 121 may include an amplifier dedicated to each pixel and a microprocessor shared among all the pixels. The electronics system 121 may be electrically connected to the pixels by vias 131. Space among the vias may be filled with a filler material 130, which may increase the mechanical stability of the connection of the electronics layer 120 to the radiation absorption layer 110. Other bonding techniques are possible to connect the electronics system 121 to the pixels without using vias. The electronics system 121 may be configured to count photons by the pixels or configured to measure the amounts of charge carriers accumulated at the pixels (e.g., by using an analog-to-digital converter (ADC) shared by the pixels).

Figure 3:
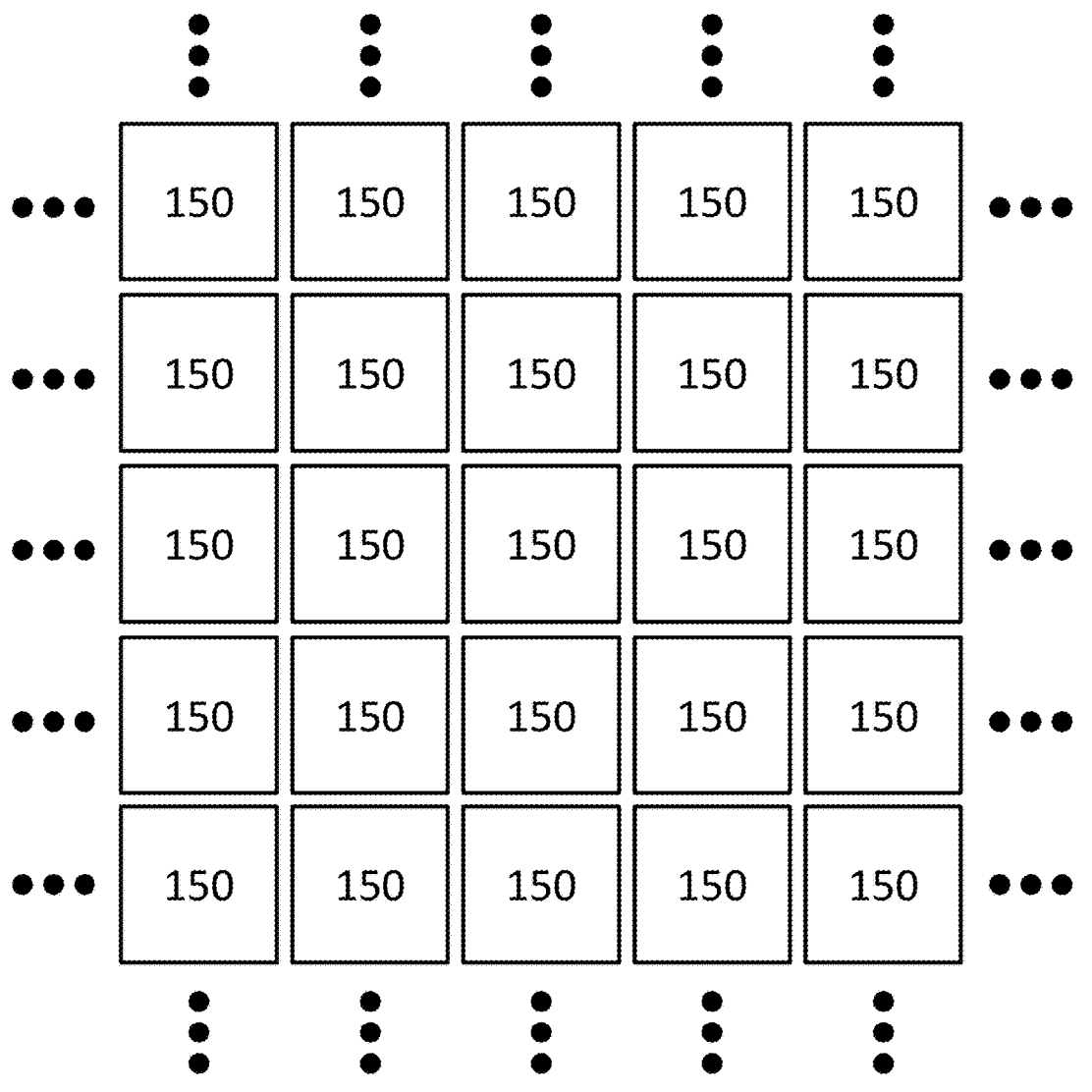

FIG. 3 schematically shows that the image sensor 100 may have an array of pixels 150. The array may be a rectangular array, a honeycomb array, a hexagonal array or any other suitable array. Each pixel 150 may be configured to detect (e.g., with the associated diode) a photon incident thereon, measure the energy of the photon, or both. For example, each pixel 150 may be configured to count numbers of photons incident thereon whose energy falls in a plurality of bins, within a period of time. All the pixels 150 may be configured to count the numbers of photons incident thereon within a plurality of bins of energy within the same period of time. Each pixel 150 may have its own electronics system 121 configured to convert an analog signal representing the energy of an incident photon or the intensity of the incident light onto that pixel 150 to a digital signal. The electronics system 121 may include an ADC. The pixels 150 may have a shared ADC. The ADC may have a resolution of 10 bits or higher. The electronics system 121 for each pixel 150 may be configured to measure its dark current, such as before or concurrently with each photon incident thereon. The electronics system 121 for each pixel 150 may be configured to deduct the contribution of the dark current from the energy of the photon incident thereon. The electronics system 121 for each pixel 150 may be configured to operate in parallel. For example, when one pixel 150 measures an incident photon, another pixel 150 may be waiting for a photon to arrive. The pixels 150 may be but do not have to be individually addressable.

According to an embodiment, the image sensor 100 may be configured to combine the digital signals from multiple pixels 150. FIG. 4A schematically shows that the total intensity of incident light in an area 1100 is "1000." The incident light in the area 1100 is detected by an array of pixels 150. FIG. 4B schematically shows that intensities of light detected by the pixels 150 in the array, the total of which is the same as the total intensity of incident light of "1000" in the area 1100. The intensities of light detected by the pixels 150 in the array may be analog signals. The intensity of light detected by each of the pixels 150 tends to be much lower than the total intensity of incident light in the area 1100. In this example, the maximum of the intensities of light detected by the pixels 150 is less than 10% of the total intensity of light. The FIG. 4C schematically shows the digital signals converted from the intensities of light detected by the pixels 150 in the array. Because the intensities of light detected by the pixels 150 in the array are usually much smaller than the total intensity, an ADC needed to convert these intensities of light detected by the pixels would have much fewer bits than an ADC needed to convert the total intensity of light in the area 1100, at the same step size. FIG. 4D schematically shows that the sum (in binary number 01111101000 in this example) of the digital signals is the same as a digital signal that would have been converted from the total intensity of light "1000."

FIG. 5 schematically shows a flow chart for a method, according to an embodiment. In procedure 5010, an image sensor is exposed to a scene. In procedure 5020, intensities of light are measured as analog signals by the pixels of the image sensor. The light may be from a scene of visible light or other electromagnetic radiation (e.g., X-ray). For example, the light may be visible light from a scintillator exposed to X-ray. In procedure 5030, the analog signals are converted to digital signals by an ADC, the digital signals representing the intensities of light the pixels measured. The pixels may share this ADC, for example, through a multiplexer. In procedure 5040, a total intensity of light in the scene is determined by calculating a sum of the digital signals. The ADC used to convert the analog signal representing the intensities measured by the pixels does not need as many bits as an ADC suitable for converting the total intensity of light in the scene, at the same step size.

Figure 6:
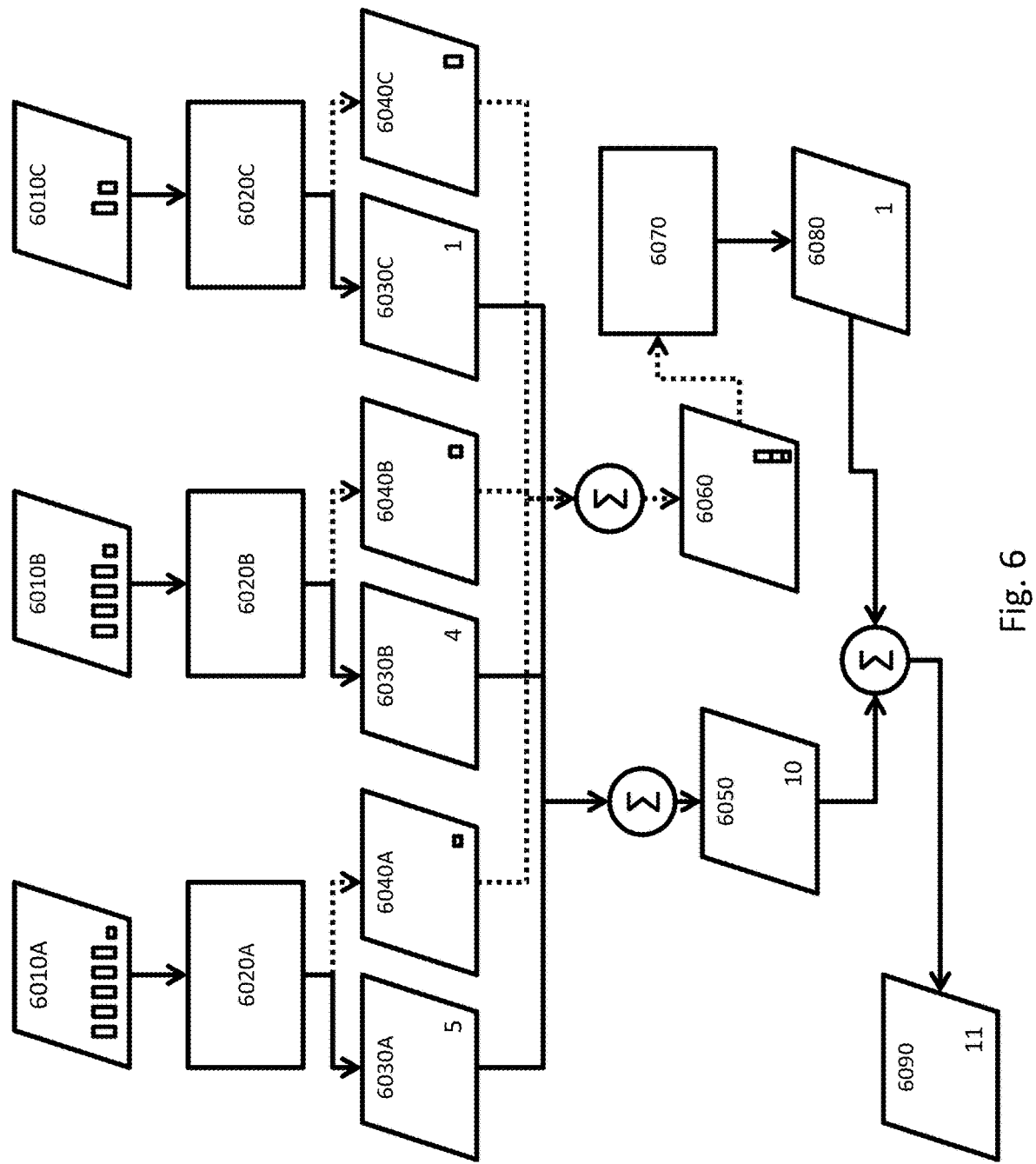
FIG. 6 schematically shows a flow chart for a method, according to an embodiment.

FIG. 6 schematically shows a flow chart for a method, according to an embodiment. Intensities of light are measured as analog signals by the pixels of the image sensor. Each of the pixels has a first ADC in the electronics system 121. The analog signals (e.g., 6010A, 6010B, 6010C, etc.) are digitized in procedure 6020A, 6020B, 6020C, etc., respectively, to digital signals 6030A, 6030B, 6030C, etc. and residue analog signals 6040A, 6040B, 6040C, etc. The residue analog signals are below the magnitude of the least significant bit (LSB) voltage of the first ADC. As schematically shown in FIG. 6, the analog signals 6010A, 6010B and 6010C respectively are digitized to digital signals 6030A (in this example, the digital signal 6030A equals 5), 6030B (in this example, the digital signal 6030B equals 4), 6030C (in this example, the digital signal 6030C equals 1); the residue analog signals 6040A, 6040B, 6040C have different magnitudes. The digital signals of the pixels are then summed as a total digital signal 6050 (in this example, the total digital signal 6050 equals 10=5+4+1). The residue analog signals 6040A, 6040B, 6040C, etc. are summed as a total residue analog signal 6060. In procedure 6070, the total residue analog signal 6060 is digitized by a second ADC the pixels share to a total residue digital signal 6080 (in this example, the total residue digital signal 6080 equals 1). The total residue digital signal 6080 and the total digital signal 6050 are summed as a total signal 6090 (in this example, the total signal 6090 equals 11=10+1).

The ADCs in the image sensor 100 may use delta-sigma (sigma-delta, $\Delta\Sigma$ or $\Sigma\Delta$) modulation. In a conventional ADC, an analog signal is integrated, or sampled, with a sampling frequency and subsequently quantized in a multi-level quantizer into a digital signal. This process introduces quantization error noise. The first step in a delta-sigma modulation is delta modulation. In delta modulation the change in the signal (its delta) is encoded, rather than the absolute value. The result is a stream of pulses, as opposed to a stream of numbers. The digital output (i.e., the pulses) is passed through a 1-bit DAC and the resulting analog signal (sigma) is added to the input signal of the ADC. In flow of FIG. 6, during the integration of the analog signal (e.g., 6010A, 6010B, 6010C, etc.) on each pixel and reaches the delta, a counter is increased by one and the delta is deducted from the analog signal. At the end of the integration, the registered value of the counter is the digital signal (e.g., 6030A, 6030B, 6030C, etc.) and the remaining analog signal smaller than the delta is the residue analog signal (e.g., 6040A, 6040B, 6040C, etc.).

Figure 7:
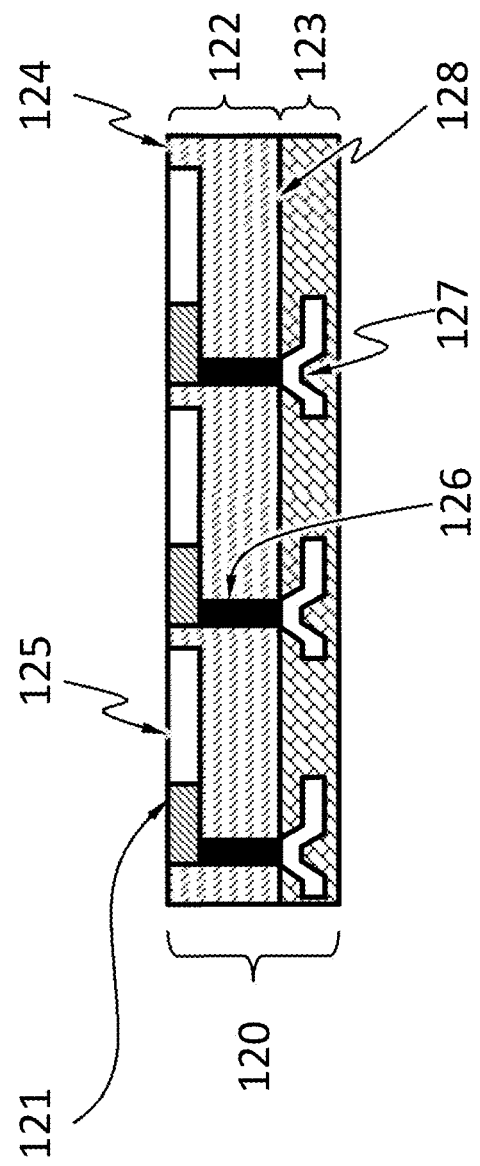
FIG. 7 schematically shows the electronics layer, according to an embodiment.

FIG. 7 schematically shows the electronics layer 120 according to an embodiment. The electronics layer 120 comprises a substrate 122 having a first surface 124 and a second surface 128. A "surface" as used herein is not necessarily exposed, but can be buried wholly or partially. The electronics layer 120 comprises one or more electric contacts 125 on the first surface 124. The one or more electric contacts 125 may be configured to be electrically connected to one or more electrodes of the radiation absorption layer 110. The electronics system 121 may be in or on the substrate 122. The electronics layer 120 comprises one or more vias 126 extending from the first surface 124 to the second surface 128. The electronics layer 120 comprises a redistribution layer (RDL) 123 on the second surface 128. The RDL 123 may comprise one or more transmission lines 127. The electronics system 121 is electrically connected to the electric contacts 125 and the transmission lines 127 through the vias 126.

The substrate 122 may be a thinned substrate. For example, the substrate may have at thickness of 750 microns or less, 200 microns or less, 100 microns or less, 50 microns or less, 20 microns or less, or 5 microns or less. The substrate 122 may be a silicon substrate or a substrate or other suitable semiconductor or insulator. The substrate 122 may be produced by grinding a thicker substrate to a desired thickness.

The one or more electric contacts 125 may be a layer of metal or doped semiconductor. For example, the electric contacts 125 may be gold, copper, platinum, palladium, doped silicon, etc.

The vias 126 pass through the substrate 122 and electrically connect electrical components (e.g., the electrical contacts 125) on the first surface 124 to electrical components (e.g., the RDL) on the second surface 128. The vias 126 are sometimes referred to as "through-silicon vias" although they may be fabricated in substrates of materials other than silicon.

The RDL 123 may comprise one or more transmission lines 127. The transmission lines 127 electrically connect electrical components (e.g., the vias 126) in the substrate 122 to bonding pads at other locations on the substrate 122. The transmission lines 127 may be electrically isolated from the substrate 122 except at certain vias 126 and certain bonding pads. The transmission lines 127 may be a material (e.g., Al) with small mass attenuation coefficient for the X-ray energy of interest. The RDL 123 may redistribute electrical connections to more convenient locations.

Figure 8:
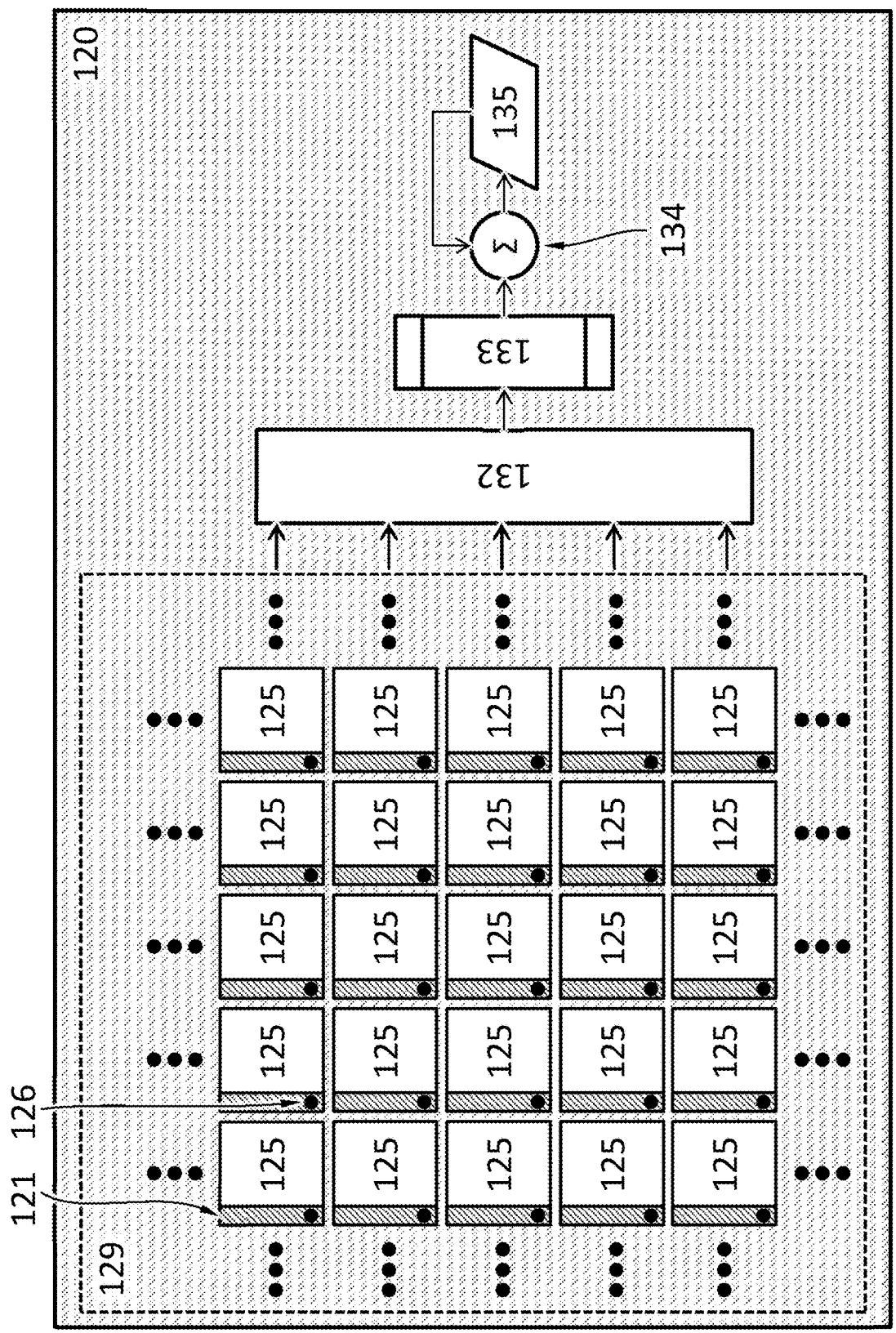
FIG. 8 schematically shows a top view of the electronics layer of FIG. 7, according to an embodiment.

FIG. 8 schematically shows a top view of the electronics layer 120 of FIG. 7, according to an embodiment. The electronics layer 120 may have a multiplexer 132. The multiplexer 132 is electrically connected to the diodes in the radiation absorption layer 110 through the electrical contacts 125 in an area 129 and configured to selectively direct analog signals from the diodes one by one to an ADC 133. The electrical contacts 125 may be bonded to the electrical contacts 1198. The analog signals on the electrical contacts 125 thus may be the analog signals (e.g., electric current or voltage) of the diodes in the radiation absorption layer 110. The ADC 133 converts the analog signals to digital signals. The digital signals output from the ADC 133 are directed to a circuit 134 (e.g., an arithmetic logic unit (ALU)) configured to combine the digital signals. The combined digital signals are stored in a memory 135.

Figure 9:
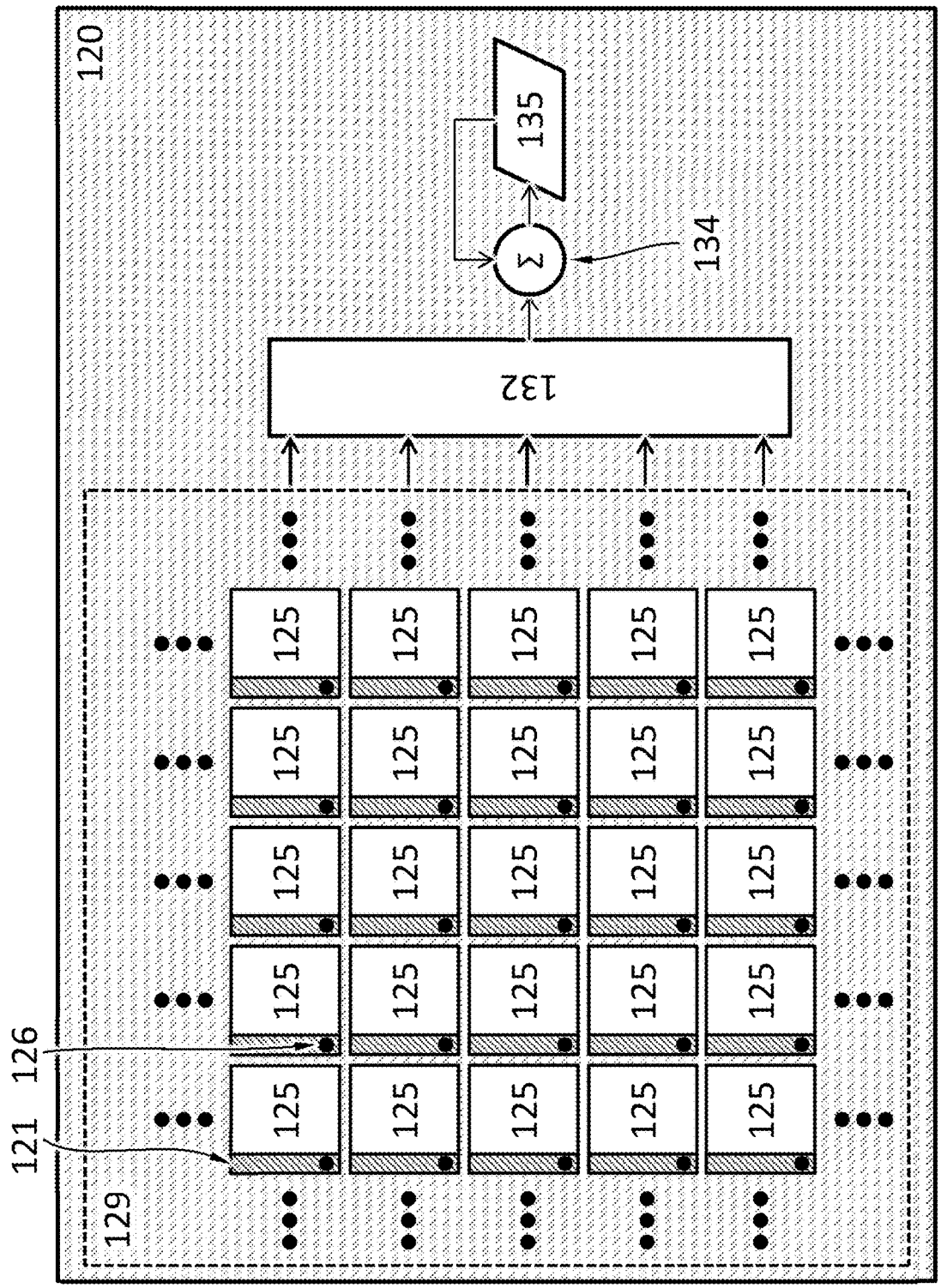
FIG. 9 schematically shows a top view of the electronics layer of FIG. 7, according to an embodiment.

FIG. 9 schematically shows a top view of the electronics layer 120 of FIG. 7, according to an embodiment. The electronics system 121 for each pixel 150 has a built-in ADC 133. The pixels 150 do not share an ADC. The ADC 133 converts an analog signal (e.g., electric current or voltage from the diode in that pixel 150) to a digital signal. The electrical contacts 125 may be bonded to the electrical contacts 119B. The digital signals on the electrical contacts 125 thus may be the digital signals output from the built-in ADC. The electronics layer 120 may have a multiplexer 132. The multiplexer 132 is electrically connected to the diodes in the radiation absorption layer 110 through the electrical contacts 125 in an area 129 and configured to selectively direct digital signals from the diodes one by one to a circuit 134 (e.g., an arithmetic logic unit (ALU)) configured to combine the digital signals. The combined digital signals are stored in a memory 135.

Figure 10:
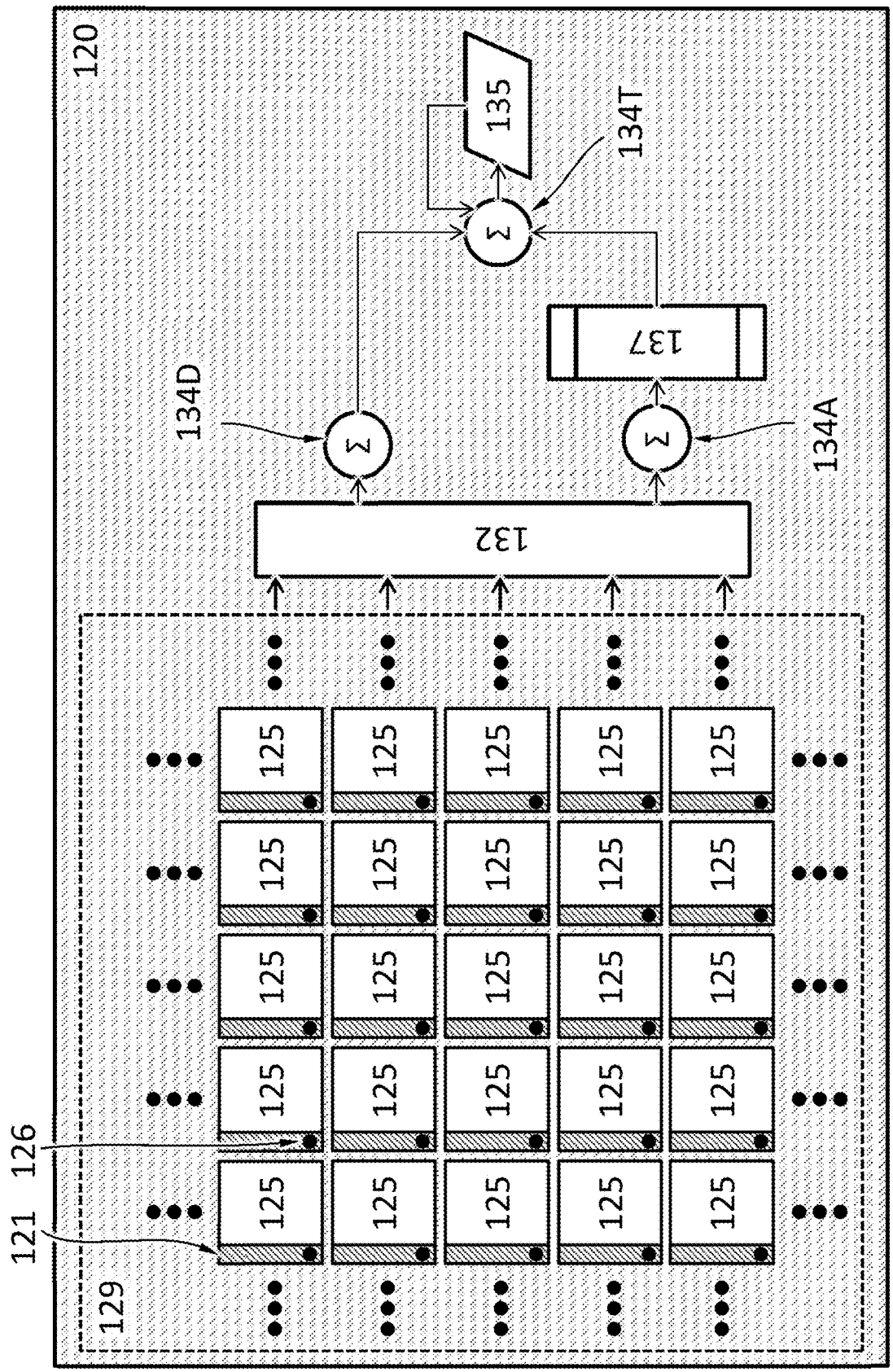
FIG. 10 schematically shows a top view of the electronics layer of FIG. 7, according to an embodiment.

FIG. 10 schematically shows a top view of the electronics layer 120 of FIG. 7, according to an embodiment. The electronics layer 120 has a two-stage ADC such as a sigma-delta ADC. The electronics system 121 for each pixel 150 has a built-in ADC 133 as the first stage. The ADC 133 converts an analog signal (e.g., electric current or voltage from the diode in that pixel 150) to a digital signal. The electrical contacts 125 may be bonded to the electrical contacts 119B. The digital signals on the electrical contacts 125 thus may be the digital signals output from the built-in ADC 133. The electronics layer 120 may have a multiplexer 132. The multiplexer 132 is electrically connected to the diodes in the radiation absorption layer 110 through the electrical contacts 125 in an area 129. The multiplexer 132 is configured to selectively direct digital signals from the diodes one by one to a circuit 134D (e.g., an arithmetic logic unit (ALU)) configured to combine the digital signals as a total digital signal. The multiplexer 132 is configured to selectively direct residue analog signals of the built-in ADC 133 one by one to a circuit 134A configured to combine the residue analog signals as a total residue analog signal. The total residue analog signal is fed into an ADC 137 as the second stage. The ADC 137 is shared by the pixels 150. The ADC 137 digitizes the total residue analog signal as a total residue digital signal. The total residue digital signal and the total digital signal are combined at a circuit 134T as a total signal. The total signal is stored in a memory 135.

Figure 11:
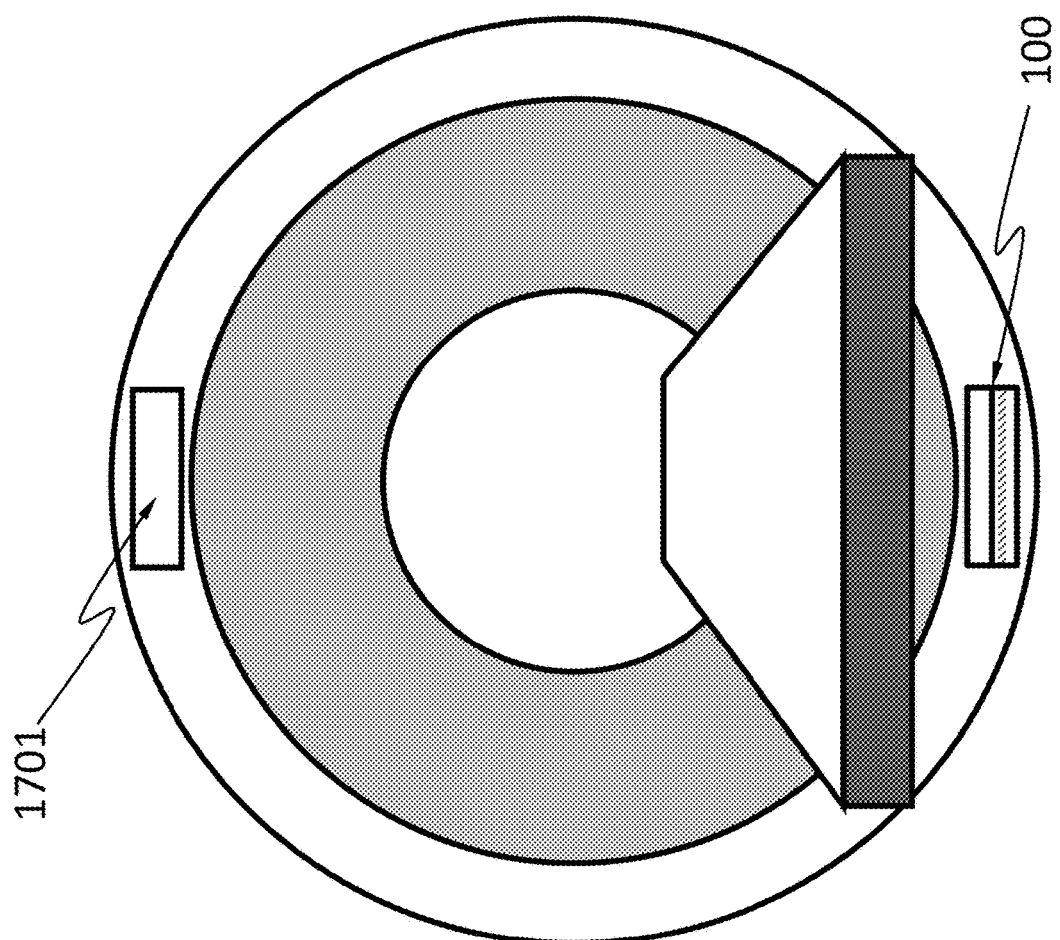
FIG. 11 schematically shows an X-ray computed tomography (X-ray CT) system comprising the image sensor described herein, according to an embodiment.

FIG. 11 schematically shows an X-ray computed tomography (X-ray CT) system. The X-ray CT system uses computer-processed X-rays to produce tomographic images (virtual "slices") of specific areas of a scanned object. The tomographic images may be used for diagnostic and therapeutic purposes in various medical disciplines, or for flaw detection, failure analysis, metrology, assembly analysis and reverse engineering. The X-ray CT system comprises the image sensor 100 described herein and an X-ray source 1701. The image sensor 100 and the X-ray source 1701 may be configured to rotate synchronously along one or more circular or spiral paths.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method, comprising:
   exposing an image sensor to a scene;
   measuring, as analog signals, intensities of light from the scene by a plurality of pixels of the image sensor;
   converting the analog signals to digital signals;
   determining residue analog signals from conversion of the analog signals to the digital signals;
   determining a total residue analog signal by summing the residue analog signals; and
   determining the total intensity of light by calculating a sum of the digital signals of all of the pixels of the entire image sensor;
   wherein the light is visible light or X-ray.

2. The method of claim 1, wherein an ADC is used in converting the analog signals to the digital signals.

3. The method of claim 2, wherein the plurality of pixels share the ADC.

4. The method of claim 3, wherein the plurality of pixels share the ADC through a multiplexer.

5. The method of claim 2, wherein the ADC uses delta-sigma modulation.

6. The method of claim 1, wherein determining the total intensity of light is further based on the total residue analog signal.

7. An image sensor, comprising:
   a plurality of diodes;
   a first ADC configured to convert analog signals from the diodes into digital signals and configured to output residue analog signals from conversion of the analog signals to the digital signals;
   a first circuit configured to calculate combined digital signals as a sum of the digital signals of all of the diodes of the entire image sensor;
   a second circuit configured to combine the residue analog signals as a total residue analog signal; and
   wherein the image sensor is configured to determine the total intensity of light received by all of the diodes based on the combined digital signals;
   wherein the light is visible light or X-ray.

8. The image sensor of claim 7, further comprising a multiplexer electrically connected to the diodes.

9. The image sensor of claim 8, wherein the multiplexer is configured to selectively direct the analog signals from the diodes to the first ADC.

10. The image sensor of claim 7, further comprising a second ADC configured to convert the total residue analog signal into a total residue digital signal.

11. The image sensor of claim 10, further comprising a third circuit configured to combine the combined digital signals and the total residue digital signal.

12. An X-ray computed tomography (X-ray CT) system comprising the image sensor of claim 7 and an X-ray source.

13. The method of claim 7, wherein the image sensor is configured to determine the total intensity of light further based on the total residue analog signal.

* * * * *